(12) United States Patent
Rajasekaran et al.

(10) Patent No.: US 10,979,330 B2
(45) Date of Patent: Apr. 13, 2021

(54) COMMUNICATION OF ELECTRIC POWER SYSTEM SAMPLES WITHOUT EXTERNAL TIME REFERENCE

(71) Applicant: Schweitzer Engineering Laboratories, Inc., Pullman, WA (US)

(72) Inventors: Manodev J. Rajasekaran, Pullman, WA (US); Greg Rzepka, Pullman, WA (US); Bryon S. Bridges, Liberty Lake, WA (US)

(73) Assignee: Schweitzer Engineering Laboratories, Inc., Pullman, WA (US)

(*) Notice: Subject to any disclaimer, the term of this patent is extended or adjusted under 35 U.S.C. 154(b) by 126 days.

(21) Appl. No.: 16/414,471

(22) Filed: May 16, 2019

(65) Prior Publication Data

US 2020/0112162 A1 Apr. 9, 2020

Related U.S. Application Data

(60) Provisional application No. 62/742,876, filed on Oct. 8, 2018.

(51) Int. Cl.
*H04L 12/26* (2006.01)
*H02H 3/10* (2006.01)
*H02H 1/00* (2006.01)
*G01R 31/08* (2020.01)

(52) U.S. Cl.
CPC ........ *H04L 43/0852* (2013.01); *G01R 31/086* (2013.01); *H02H 1/0007* (2013.01); *H02H 1/0092* (2013.01); *H02H 3/10* (2013.01); *H04L 43/0864* (2013.01)

(58) Field of Classification Search
CPC ...... H02H 3/10; H02H 1/0092; H02H 1/0007; H04L 43/0852; H04L 43/0858; H04L 43/0864; G01R 31/086; G01R 19/2513; H02J 3/0012; H02J 13/0004; H02J 13/00004; H02J 13/00002; Y04S 40/00
See application file for complete search history.

(56) References Cited

U.S. PATENT DOCUMENTS

| 6,847,297 | B2 | 1/2005 | Lavoie |
| 6,999,291 | B2 | 2/2006 | Andarawis |
| 7,058,482 | B2 | 6/2006 | Fletcher |
| 10,375,108 | B2 * | 8/2019 | Schweitzer, III ....... H04L 43/16 |

(Continued)

OTHER PUBLICATIONS

ABB "Substation Automation: We are energizing the digital grid I am SAM600 process bus IO system" ABB Switzerland Ltd, 2014.

(Continued)

*Primary Examiner* — Alex Torres-Rivera
(74) *Attorney, Agent, or Firm* — Bradley W. Schield; Richard M. Edge (57) ABSTRACT

Disclosed herein is a system for time aligning electric power system measurements at an intelligent electronic device (IED) from signals from merging units where the merging unit does not require a common or external time source. Communications from merging units may arrive at different times due to differences in communication latency or other factor. The IED may associate digital samples from merging units with a local time domain of the IED based on the data acquisition, data processing, and data communication latency in communicating with the merging units.

17 Claims, 9 Drawing Sheets

(56) References Cited

U.S. PATENT DOCUMENTS

| | | | |
|---|---|---|---|
| 2014/0074415 A1 | 3/2014 | Rudolph | |
| 2015/0089027 A1* | 3/2015 | Zweigle | H04L 43/065 709/219 |
| 2015/0222520 A1* | 8/2015 | Thrybom | H04J 3/0667 370/252 |
| 2017/0026252 A1* | 1/2017 | Dearien | H04L 41/20 |
| 2017/0195362 A1* | 7/2017 | Schweitzer, III | G06F 11/0709 |
| 2018/0309565 A1* | 10/2018 | Paterson | H04L 43/0858 |

OTHER PUBLICATIONS

Damien Tholomier and Denis Chatrefou "IEC 61850 Process Bus—It is Real!" PAC World—Winter 2008 Issue, May 2008.

Siemens "SIPROTEC 7SC805 Merging Unit for Conventional Instrument Transformer" Siemens AG, Mar. 2015.

Reason "MU320 Merging Unit", Alstom Company, 2014.

Veselin Skendzic, et al. "IEC 61850-9-2 Process Bus and Its Impact on Power System Protection and Control Reliability" Presented at the 9th Annual Western Power Delivery Automation Conference, Spokane, Washington, Apr. 2007.

* cited by examiner

COMMUNICATION OF ELECTRIC POWER SYSTEM SAMPLES WITHOUT EXTERNAL TIME REFERENCE

RELATED APPLICATION

The present application claims the benefit under 35 U.S.C. § 119(e) of U.S. Provisional Patent Application No. 62/742,876 entitled "Time Alignment of Electric Power System Samples Without External Time Reference", filed Oct. 8, 2018, which is herein incorporated by reference in its entirety and for all purposes.

TECHNICAL FIELD

This disclosure relates to communication of power system samples. More particularly, this disclosure relates to an intelligent electronic device (IED) that receives electric power system samples from merging units without communicating time stamps of the samples.

BRIEF DESCRIPTION OF THE DRAWINGS

Non-limiting and non-exhaustive embodiments of the disclosure are described, including various embodiments of the disclosure with reference to the figures.

DETAILED DESCRIPTION

Electric power delivery systems are widely used in facilitation of generation, transmission, distribution, and consumption of electric power. Such systems include a wide variety of equipment specifically designed for the purposes of electric power delivery. Such equipment is, at times, subject to conditions outside of the specified operating parameters thereof, which may result interruption in the generation, delivery, or consumption of electric power. In order to mitigate against or avoid such conditions, electric power delivery equipment and systems of equipment are often monitored using intelligent electronic devices (IEDs) that gather information from the equipment, determine operating conditions, and take an action if the determined operating conditions are outside of acceptable parameters.

For example, a three-phase electric power transmission line of an electric power delivery system may be used to carry electric power on separate conductors over long distances at a high voltage. The conductors are insulated from each other and the ground. A failure of the insulation may occur for multiple reasons resulting in one conductor coming into electrical contact with another conductor or the ground. Such a failure is commonly referred as a fault. An IED may be used to monitor such transmission line by obtaining electrical information from the transmission line such as, for example, voltages and currents of the transmission line. The IED may obtain the electrical information from one end or both ends of the transmission line, and may operate to detect fault conditions on the transmission line. If a fault condition is detected, the IED may command a circuit breaker to open, removing electric power from the transmission line. Monitoring, detecting faults, and commanding a protective action using information from both ends of the line may be performed using a differential element of the IED.

In some implementations, the IED may obtain electric power system signals from multiple power system locations or equipment in order to apply monitoring and protection to the electric power system. The IED may obtain the signals directly from instrument transformers such as current transformers (CTs), potential transformers (PTs), Rogowski coils, or the like, which are in electrical communication with the electric power system. Such implementations may require electrical (copper) connections between instrument transformers and the IED. Such implementations use a large amount of wiring, connections, and the like, which increases complexity and reduces safety.

Alternatively and/or additionally, merging units may be used to obtain signals from instrument transformers, sample and digitize the analog signals, and communicate the digitized analog signals back to the IED using, for example, fiber-optic media. Because the merging units may be located at different distances from the IED or use different media in communication, communications from the merging units may arrive at the IED after different delays. Further, sampling at the merging units may occur at different times. One way to account for such delays is to supply each merging unit and the IED with a common time source such as, for example, a time signal from a global navigation satellite system (GNSS) such as GPS, or the like. Each merging unit may then time stamp each sample and communicate the digitized analog samples along with time stamps for time alignment at the IED.

However, adding common time signals at each device increases complexity. For example, each merging unit may communicate the quantity and the associated time stamp with each sample, thereby increasing complexity of communicating the sample data. Accordingly, what is needed is a system for obtaining power system signals at an IED without using a common time signal at each merging unit.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Several aspects of the embodiments described may be implemented as software modules or components. As used herein, a software module or component may include any type of computer instruction or computer executable code located within a memory device and/or transmitted as electronic signals over a system bus or wired or wireless network. A software module, element, or component may, for instance, comprise one or more physical or logical blocks of computer instructions, which may be organized as a routine, program, object, component, data structure, etc., that performs one or more tasks or implements particular abstract data types.

In certain embodiments, a particular software module, element, or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a non-transitory computer and/or machine-readable medium having stored thereon instructions that may be used to program a computer (or other electronic device) to perform processes described herein. For example, a non-transitory computer-readable medium may store instructions that, when executed by a processor of a computer system, cause the processor to perform certain methods disclosed herein. The non-transitory computer-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of machine-readable media suitable for storing electronic and/or processor executable instructions.

Figure 1:
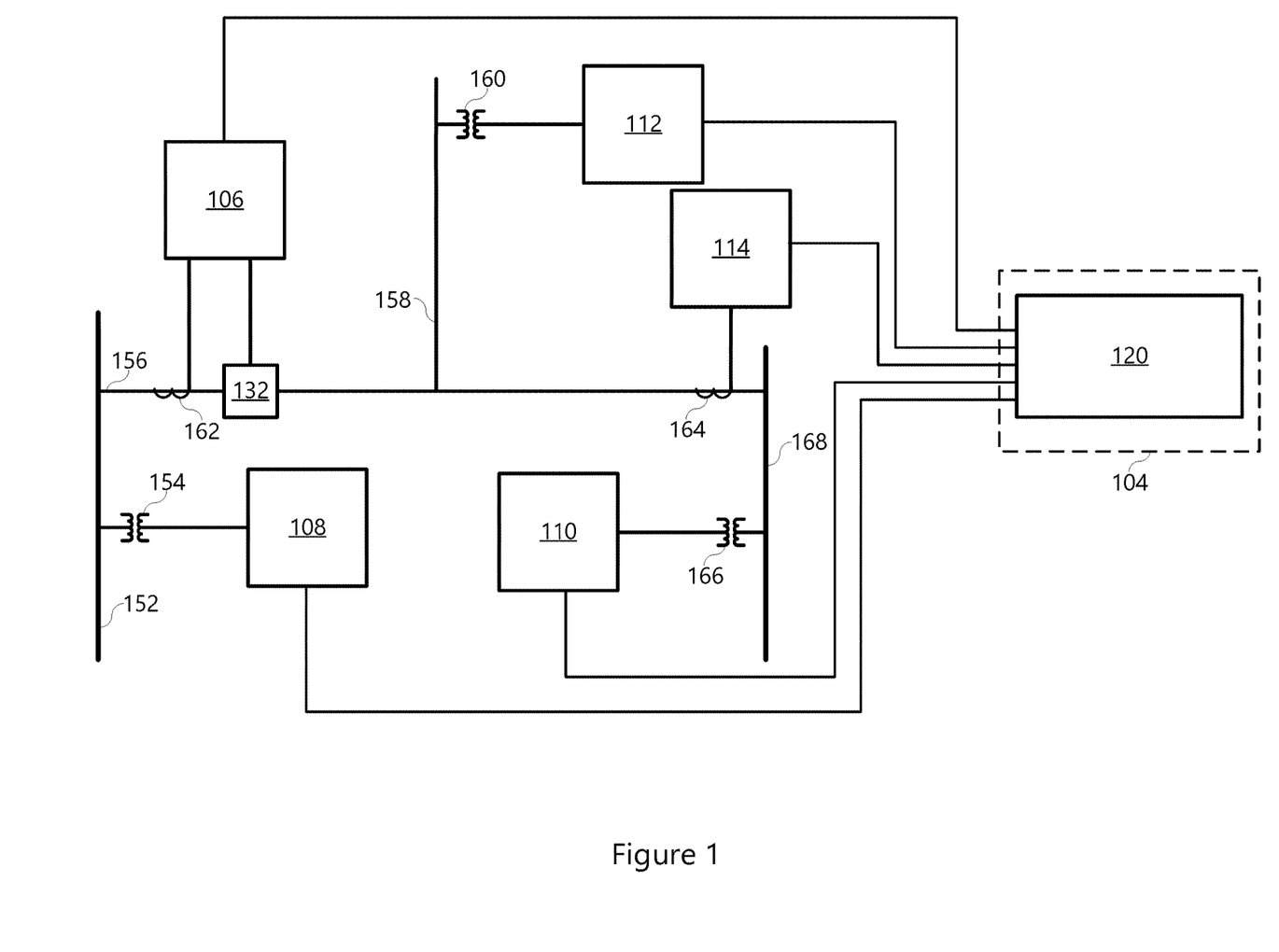
FIG. 1 illustrates a simplified one-line diagram of an electric power delivery system including merging units and an intelligent electronic device (IED), in accordance with an embodiment.

FIG. 1 illustrates a simplified one-line diagram of an electric power delivery system that includes buses 152 and 168 connected using line 156, which feeds a branch 158. Voltages from bus 152 are sampled using merging unit 108 and a PT 154. Voltages from bus 168 are sampled using merging unit 110 and a PT 166. Currents at each end of line 156 are sampled using merging units 106 and 114 in communication with CTs 162 and 164, respectively. Voltages on the branch 158 are sampled using merging unit 112 in communication with PT 160. The merging units may be at different locations or within the same switchyard. The merging units are in communication with IED 120, with each merging unit being connected with the IED 120 with a separate physical media for point-to-point communication with the IED 120.

In various embodiments, IED 120 may control operations of equipment on the electric power delivery system using the merging units. For example, merging unit 106 may be in communication with breaker 132. Upon a command from IED 120, merging unit 106 may command breaker 132 to open and/or close. As described herein, communications from the IED 120 to the merging unit 106 may be hardware accelerated messages to the merging unit with a binary signal to operate the breaker. Such hardware accelerated messages improve the speed of communication and, thereby, also improve the speed of protection. IED 120 may be within a substation or control enclosure 104. IED 120 may receive and send communications with the merging units using the various communication media as illustrated which may include, for example, fiber optic communications. To improve monitoring and protection by the IED 120, it is desired that samples from each of the merging units be arranged according to the time at which the sample was obtained to represent the state of the electric power delivery system at those times. As suggested above, the lengths of each of the fiber optic cables may be different, or the media may vary such that the communication delay times from each of the merging units may be different. As described herein, the IED may account for these different communication delays by associating the digitized samples with an estimated time at which the sample was measured by the merging unit, which eliminates the need to communicate a time stamp with each sample from each merging unit.

Figure 2:
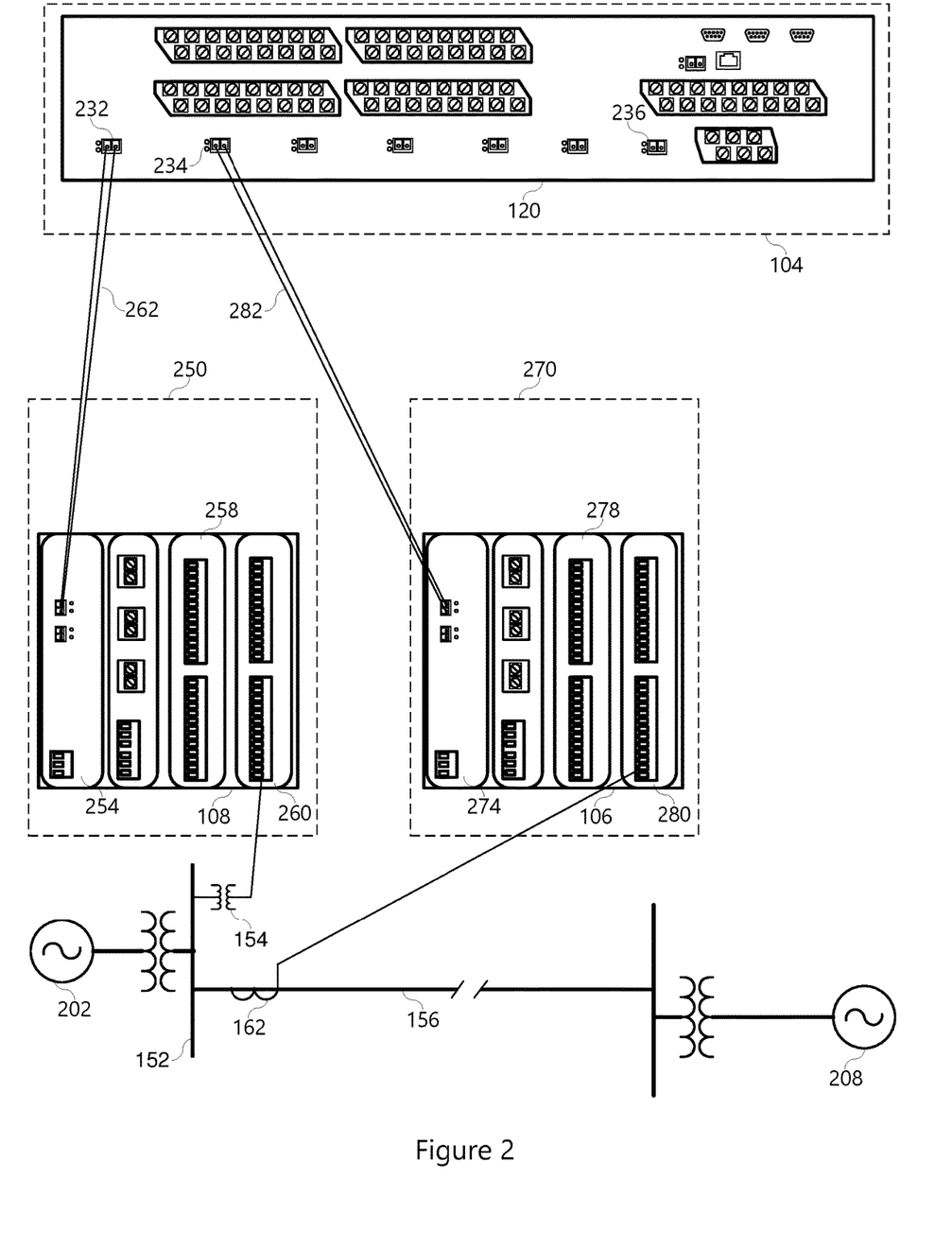
FIG. 2 illustrates a simplified block diagram of an electric power system protection device in communication with merging units for obtaining electric power system signals from the electric power system, in accordance with an embodiment.

FIG. 2 illustrates a simplified block diagram of a system for protection of an electric power delivery system, including obtaining electric power system signals from a number of merging units. Specifically, illustrated is a simplified one-line diagram of an electric power delivery system that includes generation 202 and 208 at different ends of a transmission line 156. Instrument transformers 154 and 162 are at different locations on the electric power delivery system and may provide power system signals to merging units 252 and 272, respectively.

Merging unit 252 may be located in a first substation 250 near the instrument transformer(s) 154 for obtaining electric power delivery system signals from a first location, sampling and digitizing the signals, and communicating the digitized signals to IED 120. The merging unit 252 may include various input and/or output modules 258, 260 to obtain signals. As illustrated, input module 260 is in electrical communication with instrument transformer 204. Module 254 is in communication with the IED 230 to send digitized signals to the IED and receive communications from the IED 120.

Similarly, merging unit 272 may be located in a second substation 270 near the instrument transformer(s) 162 for obtaining electric power delivery system signals from a second location, sampling and digitizing the signals, and communicating the digitized signals to IED 120. The merging unit 272 may include various input and/or output modules 278 and 280 to obtain signals. As illustrated, input module 280 is in electrical communication with instrument transformer 162. Module 274 is in communication with the IED 120 to send digitized signals to and receive communications from the IED 120.

In normal operation, the merging units 252 and 272 obtain electric power system signals from a first location and a second location using instrument transformers 154 and 162. The merging units 252 and 272 sample and digitize the electric power system signals and communicate the signals to IED 120. The IED 120 may perform monitoring and protection functions, such as differential protection of the electric power delivery system, using the power system signals from the first location and from the second location. Upon detection of a fault, the IED 120 may send a command to one or both of the merging units 252 and 272 to perform a protective function such as opening a circuit breaker.

Merging unit 252 may provide communications to IED 120 using communication medium 262; and merging unit 272 may provide communications to IED 120 using communication medium 282. Communication media 262 and 282 may be different lengths or may be composed of different material. Such factors affect the time communication takes to travel between the merging unit and the IED. Accordingly, the communication from one merging unit may take a different amount of time than communication from another merging unit.

Figure 3:
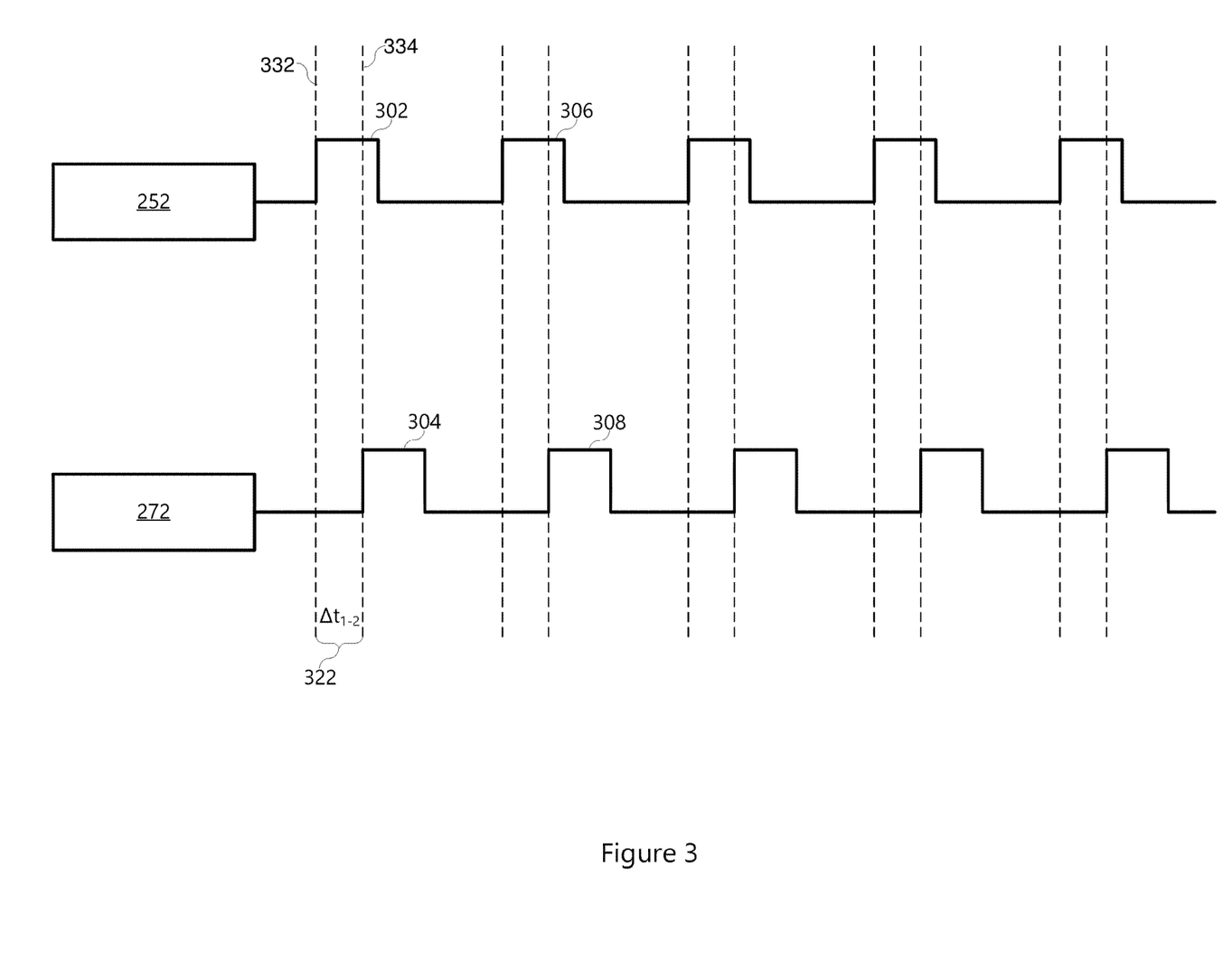
FIG. 3 illustrates timing diagram of communications from merging units arriving at an IED, in accordance with an embodiment.

FIG. 3 illustrates a timing diagram of communications received by the IED 120 from merging units 252 and 272. Due to different latencies in the communication media 262 and 282, communications from the merging units 252 and 272, when sent at the same time, may be received at the IED (such as IED 120) at different times. As illustrated, a first communication 302 from merging unit 252 is sent at the same instant in time as a first communication 304 from merging unit 272. The first communication 302 from merging unit 252 is received at time 332 at the IED 120, and the first communication 304 from merging unit 272 is received at time 334. That is, there may be a time difference of $\Delta t$ 322 between receipt of communication 302 and 304 at IED 102. The time difference $\Delta t$ 322 may be referred to as a latency difference. To properly apply monitoring and protection functions, it is desirable to associate the communications 302 and 304 with the times at which the samples were measured to account for the latency differences in the communications 302 and 304. According to several embodiments herein, the IED may measure the latency to communicate with different merging units and associate the digitized samples from different merging units based on the latency to arrange and/or align the communications from the different merging units according to a local time domain of a local clock of the IED. Although only two different merging units are illustrated in this timing diagram, it should be noted that several merging units may provide digitized analog signals to the IED, as suggested in FIG. 1.

Figure 4:
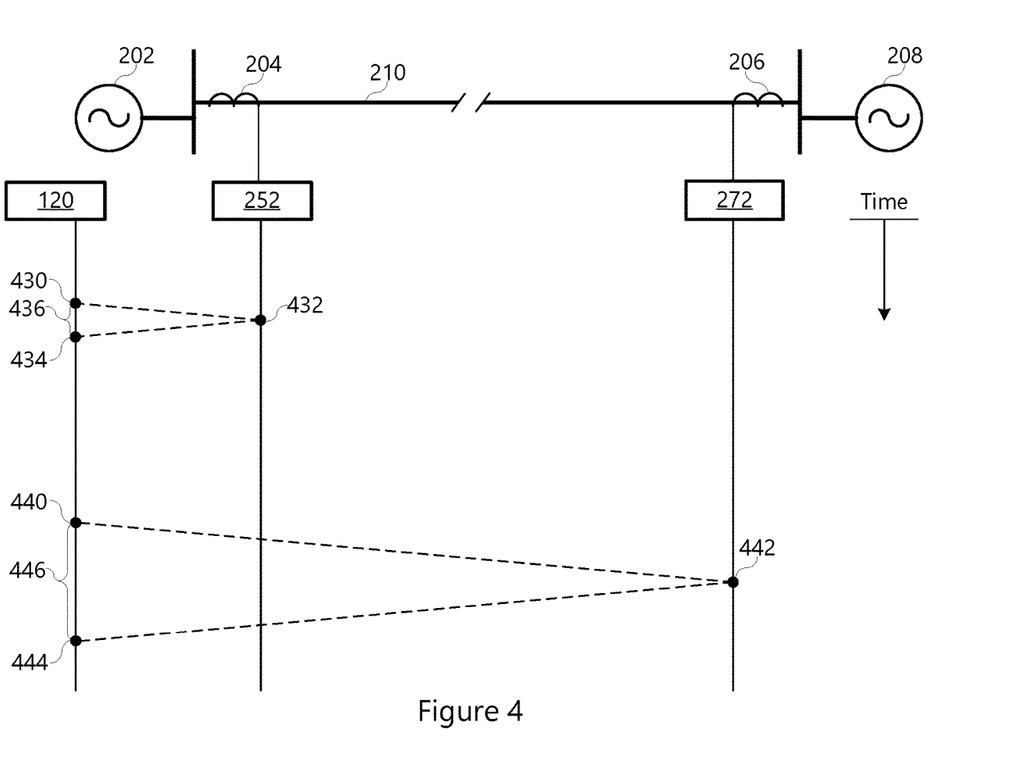
FIG. 4 illustrates a timing diagram of obtaining communication delay times from merging units, in accordance with an embodiment.

FIG. 4 illustrates a communication timing diagram between IED 120 and merging units 252 and 272 to determine a communication latency from the merging units 252 and 272 to the IED 120. In one embodiment, as illustrated, IED 120 sends a request to IED 252 at time 430. The communication is received at merging unit 252 at time 432. After some processing time delay (not illustrated), a response communication is sent back to IED 120, and received at time 434 at time 120. A round-trip communication latency time $\Delta t_1$ 436 may refer to the time between when a request is sent (time 430) and when a response is received (time 434), which is calculated as a difference between times 434 and 430. In several embodiments, the communication latency from the merging unit 252 to the IED 120 is one-half of the communication latency $\Delta t_1$ 436. Accordingly, IED 120 can calculate the communication latency from merging unit 252 to IED 120 as half of the round-trip communication latency $\Delta t_1$ 436.

Similarly, IED 120 may send a communication at time 440 to merging unit 272, which is received at time 442. After some processing delay (not illustrated) a response communication is sent back to IED 120, and received at IED 120 at time 444. The round-trip communication time $\Delta t_2$ 446 is calculated as the difference between times 444 and 440. The communication latency from merging unit 272 is calculated as half of the round-trip communication time $\Delta t_2$ 446.

It should be noted that different communication latencies between different merging units may be calculated and stored in memory of the IED 120. Further, the IED 120 may use the communication latency of the first merging unit to associate the digitized sample from the first merging unit with an estimated measurement time at which the sample was taken by the first merging unit. For example, a quantity from the digitized sample of the first merging unit may be associated with an estimated measurement time of a local clock of the IED to account for the difference in time between when the sample was obtained by the merging unit and when the digitized sample is received by the IED. For instance, a quantity obtained by the IED may be determined to have been measured at the received time at the IED minus the communication latency. It should be noted that the quantities may refer to any quantity communicated from the merging units to the IED such as, for example, voltages, currents, positions, status, and the like.

Figure 5:
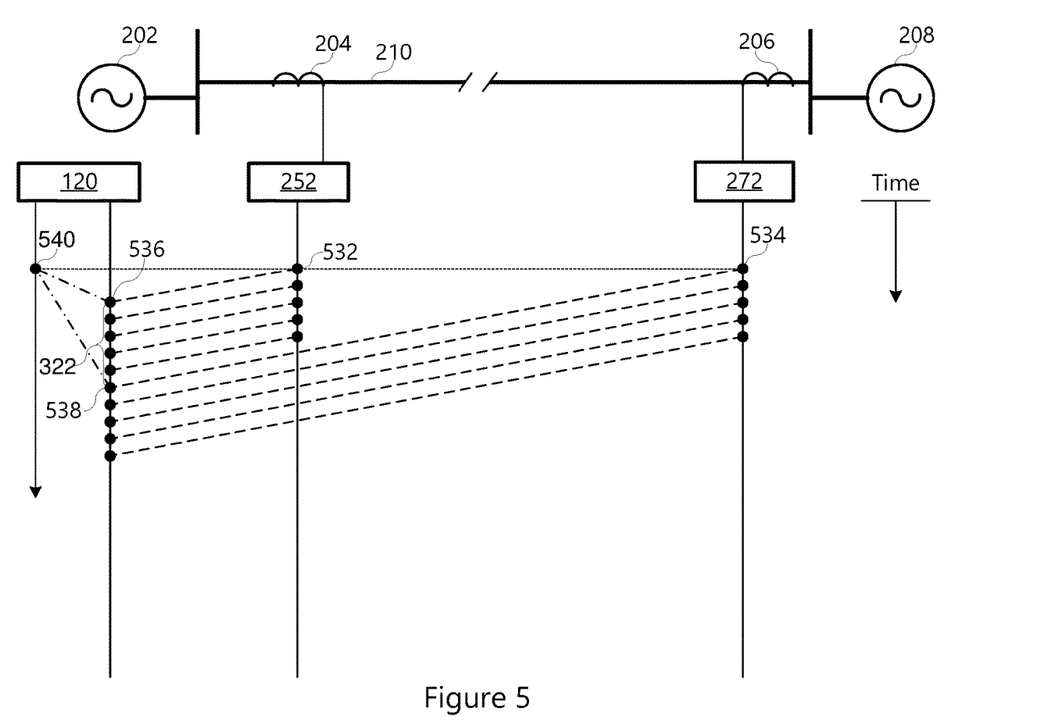
FIG. 5 illustrates a timing diagram of arranging electric power system samples without an external time reference, in accordance with an embodiment.

In some embodiments, the latency may include a processing latency of the merging unit. For example, the IED 120 may obtain a period of time in which the first merging unit measures, digitizes the samples, and forms a frame-based communication that includes the digitized sample. For instance, the processing latency may be entered by via a user input, communicated from the merging unit, or set to a preset value. In other embodiments, the processing latency may be small enough, relative to the communication latency and/or to the operation of the electric power delivery system, to not be included. FIG. 5 illustrates a communication timing diagram between IED 120 and merging units 252 and 272 where the merging units may continuously obtain signals from the electric power delivery system to measure samples of the electric power delivery system, and continuously send communications with the digitized analog signals to the IED at a predetermined rate. In systems with two or more merging units communicating the signals, the IED may continuously receive signals from the different merging units at different times and the received communications may not be aligned in time due to communication latency differences between the merging units. As illustrated, at time 532, a sample is obtained (e.g., measured) by the merging unit 252 and communicated to the IED 120. At time 534, a sample is obtained (e.g., measured) by the merging unit 272 and communicated to the IED 120.

The IED 120 receives a sample at time 536 that was sent from the merging unit 252 at time 532; and the IED 120 receives a sample at time 538 that was sent from the merging unit 272 at time 534, with several intervening communications received in the time between 536 and 538. That is, the sample from the merging unit 272 is received at time 538, which is delayed by the communication latency difference 322 between merging unit 252 and 272. The IED 120 may associate the quantity of the sample that was sent at time 532 from the merging unit 252 with an estimated measurement time of 540 based on the communication latency of the merging unit 252. Similarly, the IED 120 may associate the quantity of the sample that was sent at time 534 from the merging unit 272 with the estimated measurement time of 540 based on the communication latency of the merging unit 272. By estimating when the measurements were taken by the merging units 252 and 272, the IED 120 may more accurately assess the electric power delivery system.

Figure 6:
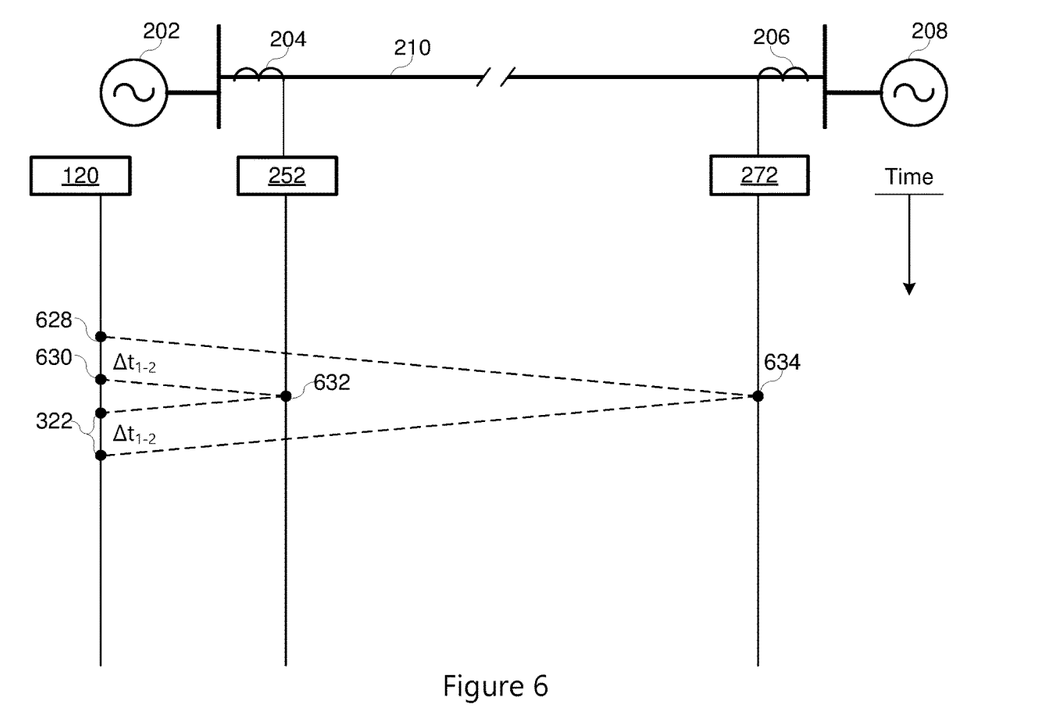
FIG. 6 illustrates a timing diagram of arranging electric power system samples without an external time reference, in accordance with an embodiment.

FIG. 6 illustrates another embodiment where the IED 120 initiates communications from the merging units such that the samples are taken at the same instant and communicated back to the IED 120. According to the illustrated embodiment, the IED 120 sends requests for samples to merging units 252 and 272 at different times separated by the communication latency difference $\Delta t_{1-2}$. That is, IED 120 sends a request to merging unit 272 at time 628, and sends the request to merging unit 252 at time 630, where times 628 and 630 are separated by the communication latency difference $\Delta t_{1-2}$. The requests are received at the merging units 252 and 272, at the same time 632 and 634. The requests may take different amounts of time depending on, for example, the differences in communication latency between the IED 120 and different merging units 252 and 272. The IED 120 may then receive the responses from the merging units 252 and 272 at times separated by the communication latency difference $\Delta t_{1-2}$ 322. By sending the requests separated in time by the communication latency difference, the IED 120 may cause the merging units to obtain samples from the electric power system at approximately the same time (e.g., within 1 ms, 500 µs, 100 µs, etc.).

Figure 7:
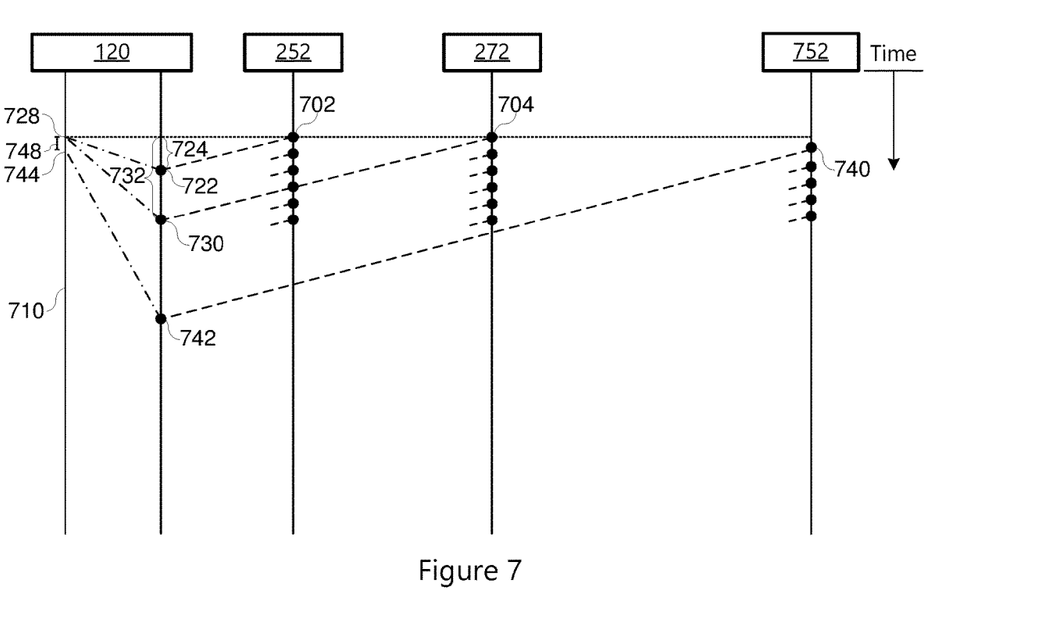
FIG. 7 illustrates a timing diagram of arranging electric power system samples from multiple merging units without an external time reference, in accordance with an embodiment.

FIG. 7 illustrates a time diagram of the IED 120 receiving communications from a multitude of merging units 252, 272, and 752, each with a different communication latencies from each other. The IED 120 may include a local clock 710 to associate received measurements with times in which the measurements were taken to monitor the conditions of the electric power delivery system. For instance, the IED 120 may count clock cycles of a processor of the IED 120 to maintain the local clock 710. In some embodiments, the local clock 710 may be synchronized with GPS time signal, GNSS time signal, or the like, to improve accuracy of the local clock 710.

In the illustrated embodiment, the first merging unit 252 obtains a sample of the electric power system at time 702, digitizes the sample, and prepares the sample to communicate to the IED 120. The IED 120 receives a digitized sample from the first merging unit 252 at time 722. The IED 120 associates the sample with an estimated measurement time 728 based on the time 722 at which the digitized sample was received by the IED 120 and the predetermined communication latency 724 between the first merging unit 252 and the IED 120. The communication latency 724 may be determined, as described with respect to FIG. 4, to be half of a round-trip latency, which may be established prior to receiving the digitized sample.

Similarly, the IED 120 may receive a digitized sample from the second merging unit 272 at time 730 that was sent at time 704. The IED 120 may associate the digitized sample from the second merging unit 272 with an estimated measurement time 728 based on the time 730 at which the digitized sample was received by the IED 120 and the communication latency 732 between the second merging unit 272 and the IED 120. As mentioned above, the communication latency 732 may be determined, as described with respect to FIG. 4, to be half of a round-trip latency established prior to receiving the digitized sample.

As shown in FIG. 7, a similar process may be performed with digitized samples received by a third merging unit 752 to time align the samples according to the local time domain of the local clock 710 based on the estimated measurement times 728 of the samples. By associating the electrical measurements with the local time domain of the local clock 710, the IED 120 may maintain the differences in the times at which measurements were taken. For instance, the third merging unit 752 is illustrated as sampling at times offset from the first merging unit 252 and the second merging unit 272. The IED 120 may associate the third merging unit 752 with a time 744 that is offset 748 from the time 728 at which the samples from the first merging unit 252 and the second merging unit 272 were estimated to have been measured. By estimating the time at which measurements were taken from the first merging unit 252, the second merging unit 272, and the third merging unit 752, the IED 120 may more accurately assess the conditions of the electric power delivery system without the added complexity of communicating time stamps with each of the measurements. The IED 120 may store each of the measurements and the respective estimated measurement times in the memory to allow operators to assess event data and the timeline of the measurements.

Figure 8:
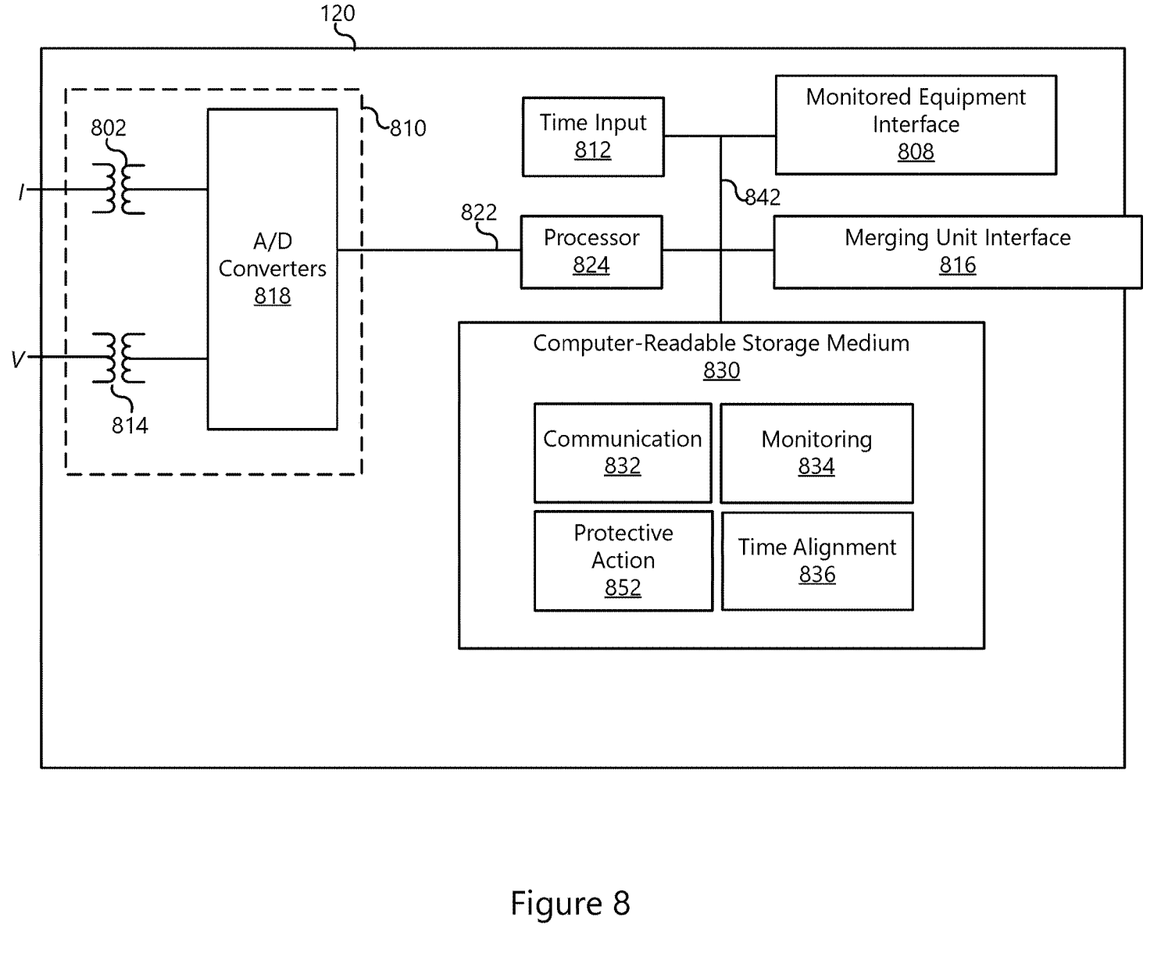
FIG. 8 illustrates a simplified block diagram of an IED for arranging electric power system samples without an external time reference, in accordance with an embodiment.

FIG. 8 illustrates a simplified block diagram of an IED 120 that may be used to acquire communications from the various merging units, arrange the communications according to the estimated measurement time in accordance with the several embodiments herein, and provide the monitoring and protective functions for the electric power delivery system. In certain embodiments, the IED 120 may obtain electric power system signals from the electric power delivery system directly using a sampling circuit 810. The sampling circuit may receive current and/or voltage signals from instrument transformers of the electric power delivery system, transform the signals to an appropriate level using transformers 802 and 814, sample the signals using A/D converter(s) 818, and communicate the digitized analog signals to a processor 824 using a bus 822. In several embodiments, the IED 120 may receive signals from merging unit communications without obtaining measurements directly from the electric power delivery system. In certain embodiments, the IED 120 may obtain measurements directly and obtain measurements from merging unit communications.

IED 120 may also include a merging unit interface 816. The merging unit interface 816 may include multiple communication ports such as ports 232, 234, and 236, and so forth of FIG. 2. The communication ports may be fiber optic ports, or ports that correspond with any applicable communication protocol. The merging unit interface 816 may be in communication with bus 842 such that communications may be available to the processor 824, and communications may be sent to merging units via merging unit interface 816.

The processor 824 may be in communication with several other elements of the IED using bus 842. The processor 824 may be any applicable processing unit such as a microprocessor, field-programmable gate array (FPGA) or the like. The processor 824 may include resident computer-readable storage media. The processor 824 may be configured to execute instructions that may be stored on computer-readable storage media. In some embodiments, the processor 824 and/or the computer-readable storage medium 830 may generally be referred to as processing circuitry.

The IED 120 may include a time input 812 if such is used for the monitoring and protection operations of the IED 120. As mentioned above, the time input 812 may be a local clock. In some embodiments, the local clock may be synchronized via GNSS, GPS, or the like. The IED 120 may also include a monitored equipment interface 808 in communication with bus 842. The monitored equipment interface may be in communication with a monitored equipment and capable of sending commands to such equipment and receiving signals from such equipment. For example, the equipment may be a circuit breaker. The monitored equipment interface 808 may obtain status information (open/closed) from the circuit breaker, and may be used by the IED 120 to send commands to the monitored equipment such as a trip command and/or a close command.

The IED 120 may include a non-transitory computer-readable storage medium 830, such as a memory, in communication with bus 842. As mentioned above, the computer-readable storage medium 830 may be part of or separate from the processor 824. The computer-readable storage medium 830 may include instructions that when executed by the processor cause the IED 120 to perform certain functions. The computer-readable storage medium 830 may include a communication module 832 that include instructions related to the communication actions of the IED 120. For example, the communications instructions 832 may include instructions that cause IED 120 to send messages to merging units, interpret communications from merging units, send commands to the monitored equipment, receive status information from the merging units, send communications to monitoring systems such as a supervisory control and data acquisition (SCADA) system, or the like.

The computer-readable storage medium 830 may include time alignment and/or arrangement instructions 836 in accordance with several embodiments herein. The time alignment and/or arrangement instructions 836 may cause the IED to associate communications from different merging units with the local time domain of the IED according to a local clock of the IED and communication latencies between the merging units and the IED, as described in the various embodiments herein.

The computer-readable storage medium 830 may include instructions for monitoring 834 and for protective action 852. The monitoring 834 may include recording power system conditions, organizing reports such as event reports, and the like. The protective action 852 may include instructions for using the measurements aligned according to the local time domain to detect an event on the power system and take a protective action when warranted. The event may include a fault event, overcurrent event, undervoltage event, or the like. The protective action may include opening a circuit breaker. For example, by associating the measurements with estimated times at which the measurements were taken, the IED 120 may more accurately detect current-over-time events, under-frequency events, among other time-related events. As an example, the protective action may include commanding a particular merging unit to open a particular circuit breaker or multiple circuit breakers based on the time-related event.

Figure 9:
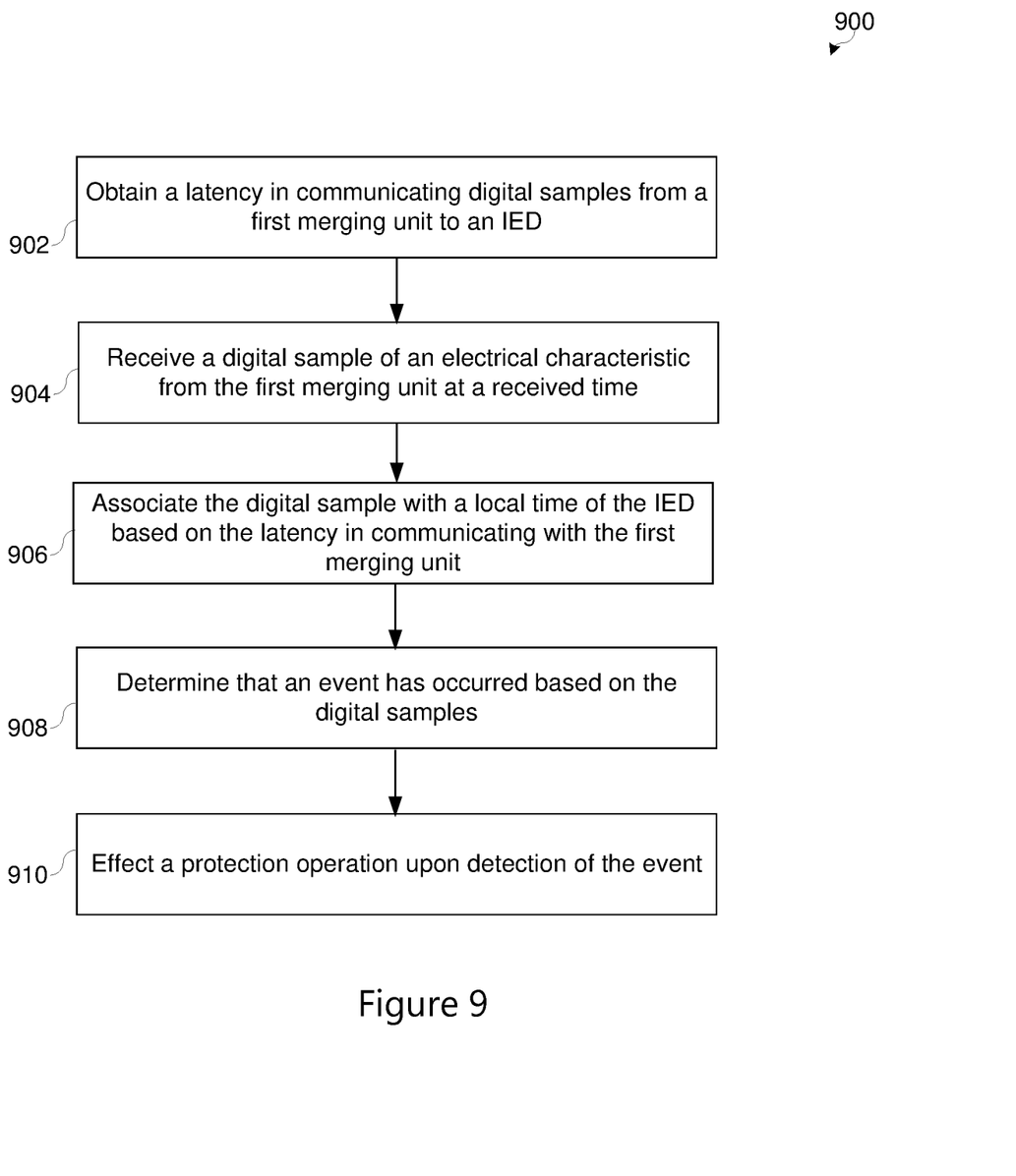
FIG. 9 illustrates a flow chart of a process performed by the IED to arrange the electric power system samples without an external time reference, in accordance with an embodiment.

FIG. 9 is a flow chart of a process performed by the IED 120, in accordance with an embodiment. The process 900 may be stored as instructions (e.g., code) on the computer-readable storage medium 830 to be executed by the processor 824. The processor 824 may obtain a latency in communicating digitized samples from a first merging unit to the IED 120 (block 902). As described with respect to FIG. 4, the IED 120 may send a first request to the first merging unit at a first time (e.g., time 430). The processor 824 may receive a first response from the first merging unit at a second time (e.g., time 434). The processor 824 may determine a round-trip latency of the first merging unit as the difference between the second time and the first time (e.g., $\Delta t_1$ 436). The processor 824 may determine the latency in communicating digitized samples from the first merging unit to the IED 120 as half of the round-trip latency. In other embodiments, the processor 824 may determine the total latency of the digitized samples that includes a processing latency, due to digitization of the sample and/or forming a frame based on the digitized sample, and the communication latency of the digitized sample.

A similar process may be performed by the IED 120 with a second merging unit to obtain another latency in communicating digitized samples from the second merging unit. For example, the processor 824 may send a second request to the second merging unit at a third time (e.g., time 440). The processor 824 may receive the second response from the second merging unit at a fourth time (e.g., time 444) and determine a round-trip latency of the second merging unit as the difference between the fourth time and the third time (e.g., $\Delta t_2$ 446). The processor 824 may then determine the latency in communicating digitized samples from the second merging unit to the IED 120. The communication latencies of the first merging unit and the second merging unit may be stored within the computer-readable medium 830 to be respectively applied to samples received from the first merging unit and the second merging unit. In some embodiments, the communication latencies may be determined prior to receiving digitized samples of the electrical quantities from the merging units. For example, the communication latencies may be determined during commissioning of the merging units and/or the IED 120.

During operation of the IED 120, the IED 120 may receive a digitized sample of an electrical characteristic from the merging unit at a received time (block 904). In some embodiments, the IED 120 may receive a frame-based communication that includes the digitized sample. The frame-based communication may comply with a standard, such as an Ethernet standard or an International Electrotechnical Commission (IEC) 61850 standard. For example, the frame-based communication may include metadata, such as a preamble, start-of-frame identifier, destination MAC address, source MAC address, EtherType, VLAN, frame check sequence, or the like. The frame-based communication may include a payload, such as the digitized sample. The processor of the IED may receive the frame-based communication from the merging unit. The processor may parse the payload of the frame-based communication according to the standard and obtain the digitized sample. In certain embodiments, the processor may use the source MAC address of the frame-based communication to determine which merging unit sent the digitized sample. The processor may use the communication latency of the merging unit that is associated with the source MAC address in the frame-based communication.

The IED 120 may then associate the digitized sample with a local time according to the local time domain of the IED 120 that is based on the latency in communicating with the first merging unit to account for a time delay between when the electrical characteristic was sampled by the first merging unit and when the digitized sample was received by the IED 120 (block 906). For example, the IED 120 may associate the digitized sample with an estimated time at which the first merging unit acquired the measurement based on the local time at which the digitized sample was received and the latency in communicating the digitized sample. By estimating a time at which the measurement was acquired based on the latency in the communication medium and the time at which the digitized sample was received, the IED 120 may more accurately assess the conditions of the electric power delivery system without communicating timing information for each digitized sample, thereby simplifying communication between the IED 120 and the merging units.

The IED 120 may then perform various operations using the digitized samples and the associated times at which the samples were measured. For example, the IED 120 may determine that an event has occurred based on the digitized samples (block 908). For instance, the time aligned samples may be used by the IED 120 to detect overcurrents, undercurrents, overvoltages, undervoltages, underfrequencies, and the like. While these are given as examples, the IED 120 may use the time-aligned samples to detect any suitable events in the power delivery system.

The IED 120 may then effect a protection operation upon detection of the event (block 910). For instance, the IED 120 may send a command signal to cause the first merging unit, the second merging unit, or another electronic device to open a circuit breaker to shed load or generation to protect the electric power delivery system. In certain embodiments, the IED 120 may send a notification signal to a display screen of the IED 120 to cause the IED 120 to display a notification of the event. In other embodiments, the IED 120 may send a notification signal to a central monitoring system indicating the occurrence of the event to allow operators to assess the event. In some embodiments, the IED 120 may store the measurements and associated time stamps to allow an operator to assess the event.

Systems and methods described above may be used to estimate the time at which a measurement of electrical characteristic occurred in an electric power delivery system without using common timing information. For example, digitized samples may be associated with a local time domain of an IED based on when the digitized sample was received and a latency in communicating between the IED and the merging unit. By accounting for the latency in communication between merging units and the IED, communication in the network may be simplified by communicating digitized samples without including timing information sent with each digitized sample.

By simplifying the communication between the merging units and the IED, the samples from the merging units may be communicated to the IED with less latency, thereby allowing faster operation of the IED in performing monitoring, control, or protection operations. For example, by using a source MAC address in frame-based communications to apply the communication latency of the merging unit associated with the MAC address, frame-based communications may have reduced payload sizes that do not include time stamps of each digitized sample. Further, by accounting for the latency between when the merging unit sends the digitized sample and when the digitized sample is received, the IED may more accurately assess conditions of the electric power delivery system. For instance, IEDs may arrange the digitized samples from merging units according to estimated times at which the measurements were obtained and, upon detecting an event using the arranged digitized samples, the IED may open a circuit breaker to shed load or to shed generation to protect the electric power system.

While specific embodiments and applications of the disclosure have been illustrated and described, it is to be understood that the disclosure is not limited to the precise configurations and components disclosed herein. Accordingly, many changes may be made to the details of the above-described embodiments without departing from the underlying principles of this disclosure. The scope of the present invention should, therefore, be determined only by the following claims.

What is claimed is:

1. An intelligent electronic device (IED), comprising:
    a memory; and
    a processor operably coupled to the memory, wherein the processor is configured to:
        receive a digitized sample of an electrical characteristic of an electric power delivery system from a first merging unit;
        associate the digitized sample from the first merging unit with a local time of the IED based at least in part on a latency in communicating with the first merging unit to account for a time delay between when the electrical characteristic was sampled by the first merging unit and when the digitized sample was received by the IED;
        receive a digitized sample of another electrical characteristic of the electric power delivery system from a second merging unit;
        associate the digitized sample from the second merging unit with another local time based on another latency in communicating with the second merging unit to account for another time delay between when the digitized sample was measured by the second merging unit and when the digitized sample measured by the second merging unit was received by the IED;
        detect an event using the digitized sample from the first merging unit; and
        effect a protection operation upon detection of the event.

2. The IED of claim 1, wherein the processor is configured to:
    determine a round-trip latency in communicating with the first merging unit; and
    determine the latency in communicating with the first merging unit as half of the round-trip latency.

3. The IED of claim 2, wherein the processor is configured to:
    send a request to the first merging unit at a first time;
    receive a response from the first merging unit at a second time; and
    prior to obtaining the digitized sample, determine the round-trip latency in communicating with the first merging unit as a difference between the second time and the first time.

4. The IED of claim 3, wherein the round-trip latency is determined during commissioning of the IED, the first merging unit, or both.

5. The IED of claim 1, wherein the processor is configured to maintain a local time domain by counting clock cycles of the processor.

6. The IED of claim 1, wherein the processor is configured to determine a total latency of the first merging unit, wherein the total latency comprises the latency in communicating and a processing latency.

7. A non-transitory, computer readable medium comprising instructions configured to be executed by a processor of an intelligent electronic device (IED) to cause the processor to:
    receive a digitized sample of an electrical characteristic of an electric power delivery system from a first merging unit;
    associate the digitized sample from the first merging unit with a local time of the IED based at least in part on a latency in communicating with the first merging unit to account for a time delay between when the electrical characteristic was sampled by the first merging unit and when the digitized sample was received by the IED;
store the digitized sample from the first merging unit and the local time in memory of the IED to allow the IED to detect time-dependent events of the electric power delivery system;
detect an event using the digitized sample from the first merging unit; and
effect a protection operation upon detection of the event.

8. The non-transitory computer readable medium of claim 7, comprising instructions configured to be executed by the processor to cause the processor to associate the digitized sample from the first merging unit with the local time in which the digitized sample was obtained at the first merging unit by subtracting the latency in communicating with the first merging unit from the local time in which the digitized sample was received by the IED.

9. The non-transitory computer readable medium of claim 7, comprising instructions configured to be executed by the processor to cause the processor to send a signal to the first merging unit to control a circuit breaker in the electric power delivery system upon detection of the event.

10. The non-transitory computer readable medium of claim 7, comprising instructions configured to be executed by the processor to cause the processor to:
receive a digitized sample of another electrical characteristic of the electric power delivery system from a second merging unit; and
associate the digitized sample from the second merging unit with another local time based on another latency in communicating with the second merging unit to account for another time delay between when the digitized sample was measured by the second merging unit and when the digitized sample measured by the second merging unit was received by the IED.

11. The non-transitory computer readable medium of claim 7, comprising instructions configured to be executed by the processor to cause the processor to:
receive a frame-based communication comprising the digitized sample from the first merging unit;
obtaining the digitized sample from a payload of the frame-based communication;
receiving a source MAC address indicating that the first merging unit sent the digitized sample; and
applying the latency in communicating with the first merging unit based at least in part on the source MAC address in the frame-based communication.

12. The non-transitory computer readable medium of claim 7, wherein the frame-based communication complies with an Ethernet standard or an IEC-61850 standard.

13. A method, comprising:
receiving, via a processor of an intelligent electronic device (IED), a frame-based communication comprising a digitized sample of an electrical characteristic of an electric power delivery system from a merging unit;
obtaining the digitized sample from a payload of the frame-based communication;
receiving a source MAC address in the frame-based communication indicating that the merging unit sent the digitized sample;
associating, via the processor, the digitized sample from the merging unit with a local time of the IED based at least in part on a latency in communicating with the merging unit and the source MAC address indicating that the merging unit sent the digitized sample;
detecting, via the processor, an event using the digitized sample from the merging unit; and
effecting, via the processor, a protection operation upon detection of the event.

14. The method of claim 13, comprising:
sending a first request to the merging unit at a first time;
receive a first response from the merging unit at a second time; and
determine a round-trip latency of the merging unit as the difference between the second time and the first time.

15. The method of claim 13, comprising sending a command signal to the merging unit to cause the merging unit to trip a circuit breaker based upon detection of the event.

16. The method of claim 13, comprising displaying a timeline of digitized samples from the merging unit on a display at an IED of the electric power delivery system, at a central monitoring station of the electric power delivery system, or both.

17. The method of claim 13, wherein the frame-based communication complies with an Ethernet standard or an IEC-61850 standard.

* * * * *